United States Patent
Poppi et al.

(10) Patent No.: US 9,159,522 B2
(45) Date of Patent: Oct. 13, 2015

(54) METHOD FOR ASSEMBLING AN ELECTRON EXIT WINDOW AND AN ELECTRON EXIT WINDOW ASSEMBLY

(75) Inventors: Luca Poppi, Formigine (IT); Paolo Benedetti, Modena (IT)

(73) Assignee: TETRA LAVAL HOLDINGS & FINANCE S.A., Pully (CH)

( * ) Notice: Subject to any disclaimer, the term of this patent is extended or adjusted under 35 U.S.C. 154(b) by 719 days.

(21) Appl. No.: 13/255,303

(22) Filed: Sep. 8, 2011

(65) Prior Publication Data

US 2012/0269997 A1 Oct. 25, 2012

Related U.S. Application Data

(60) Provisional application No. 61/160,122, filed on Mar. 13, 2009.

(30) Foreign Application Priority Data

Mar. 11, 2009 (SE) ........................................ 0900317

(51) Int. Cl.
*H05H 15/00* (2006.01)
*H01J 33/04* (2006.01)

(52) U.S. Cl.
CPC ............. *H01J 33/04* (2013.01); *H01J 2237/04* (2013.01); *Y10T 156/10* (2015.01); *Y10T 428/13* (2015.01)

(58) Field of Classification Search
CPC ....... H01J 33/04; H01J 5/18; H01J 2237/164; H01J 2237/166; B32B 38/0008

USPC ............... 428/34.1; 156/60, 293; 422/186.07; 427/122, 123; 250/429.3
See application file for complete search history.

(56) References Cited

U.S. PATENT DOCUMENTS

| | | | |
|---|---|---|---|
| 1,907,507 A | 5/1933 | Coolidge | |
| 3,211,937 A * | 10/1965 | Hester et al. | 313/420 |
| 4,112,307 A * | 9/1978 | Foll et al. | 250/505.1 |
| 4,333,036 A * | 6/1982 | Farrell | 313/420 |
| 4,461,972 A | 7/1984 | Dmitriev et al. | |
| 4,591,756 A | 5/1986 | Avnery | |
| 2004/0222733 A1 | 11/2004 | Avnery et al. | |

(Continued)

FOREIGN PATENT DOCUMENTS

| | | |
|---|---|---|
| DE | 30 22 127 A1 | 1/1982 |
| DE | 195 18 623 | 11/1996 |

(Continued)

OTHER PUBLICATIONS

International-Type Search Report dated Aug. 31, 2009, issued in the corresponding National Application No. 0900317-9.

(Continued)

*Primary Examiner* — Yan Lan
(74) *Attorney, Agent, or Firm* — Buchanan Ingersoll & Rooney PC

(57) ABSTRACT

The present invention refers to a method for assembling an electron exit window of an electron beam generating device, comprising the steps of: arranging a foil support plate on a housing of the electron beam generating device, bonding a window foil to a frame along at least one continuous bonding line, thus creating an exit window sub-assembly, and attaching the exit window sub-assembly onto the housing. The invention also relates to an electron exit window assembly.

10 Claims, 3 Drawing Sheets

(56) References Cited

U.S. PATENT DOCUMENTS

| | | |
|---|---|---|
| 2009/0160309 A1 | 6/2009 | Burth et al. |
| 2009/0212681 A1* | 8/2009 | Matsumura ................ 313/420 |
| 2012/0087842 A1* | 4/2012 | Kristiansson et al. ... 422/186.07 |

FOREIGN PATENT DOCUMENTS

| | | |
|---|---|---|
| EP | 0 059 249 | 1/1985 |
| EP | 1 775 752 | 4/2007 |
| GB | 2 166 284 | 4/1986 |
| JP | S52-99763 A | 8/1977 |
| JP | S61-38500 A | 2/1986 |
| JP | 2001-013300 A | 1/2001 |
| JP | 2008-079891 A | 4/2008 |
| JP | 2008-128977 A | 6/2008 |
| WO | WO2007/105390 * | 9/2007 |
| WO | WO 2008/062666 A1 | 5/2008 |

OTHER PUBLICATIONS

International Search Report (PCT/ISA/210) issued on Jun. 25, 2010, by European Patent Office as the International Searching Authority for International Application No. PCT/SE2010/001376.

* cited by examiner

-- PRIOR ART --

-- PRIOR ART --

METHOD FOR ASSEMBLING AN ELECTRON EXIT WINDOW AND AN ELECTRON EXIT WINDOW ASSEMBLY

THE FIELD OF THE INVENTION

The present invention refers to a method for assembling an electron exit window and an electron exit window assembly.

PRIOR ART

Electron beam generating devices may be used in sterilization of items, such as for example in sterilization of food packages or medical equipment, or they may be used in curing of e.g. ink. Generally, these devices comprise an electron exit window formed by a foil and a foil support plate. The foil support plate, which is preferably made of copper, has a plurality of apertures through which the electrons will exit from the electron beam generating device during operation. The foil may have a thickness of around 6-10 µm and may be made of titanium. Due to the thinness most of the electrons are able to pass through it.

The present invention primarily relates to electron beam generating devices used for irradiation of webs of material, i.e., electron beam generating devices having relatively large electron exit windows.

The method or process being used today for producing electron beam devices of the above type will be described in the following, referring to FIG. 1 and FIG. 2.

The electron beam device 100 comprises two parts; a tube body 102 housing and protecting the assembly 103 generating and shaping the electron beam, and a flange 104 carrying components relating to the output of the electron beam, such as the window foil 106 and the foil support plate 108 preventing the window foil 106 from collapsing as vacuum is established inside the device 100. Further, during operation of the electron beam device the foil 106 is subject to excessive heat. Thereby, the foil support plate 108 also serves the important purpose of conducting heat generated in the foil 106 during use away from the foil of the device. By keeping the foil temperature moderate a sufficiently long lifetime of the foil 106 may be obtained.

In the production the foil support plate 108, being of copper, is bonded to the flange 104, which is separate from the tube body 102 at this stage. The flange 104 is generally made of stainless steel. The window foil 106 is then bonded onto the foil support plate 108 along a line extending along the perimeter of the foil support plate 108, and excess window foil 106 is trimmed off. The foil 106 may subsequently be coated, in order to improve its properties regarding for instance heat transfer. The coating is made on the side of the foil 106 facing the outside of the electron beam generating device 100. The flange 104 is subsequently attached to the tube body 102 to form a sealed housing.

SUMMARY OF THE INVENTION

The inventors of the present invention have discovered that this prior solution is not optimal when the electron beam device is used in for example oxygen containing atmospheres. Under these circumstances the accelerated electrons will generate ozone, which is a highly corrosive substance. The ozone may corrode the copper foil support, which may in turn compromise the seal of the housing and the function of the electron beam generating device. In addition, in a packaging machine producing food packages, hydrogen peroxide is often used to sterilize the machine parts before production of packages starts. Thus, the copper foil support may come into contact with hydrogen peroxide as well. Hydrogen peroxide is also highly corrosive for the copper foil support.

The most sensitive location is the copper volume at the bonding line with the foil 106. Here, the corrosion only needs to work underneath the bonding line, which is only a few tenths of a millimeter, in order to result in the unfortunate result described above.

The present invention aims at solving this problem by providing a method for assembling an electron exit window of an electron beam generating device, comprising the steps of: arranging a foil support plate on a housing of the electron beam generating device, bonding a window foil to a frame along at least one continuous bonding line, thus creating an exit window sub-assembly, and attaching the exit window sub-assembly onto the housing.

There are several advantages with the inventive method, one being that the attachment of the foil to the corrosion-proof frame, which in turn is bonded into a flange of the housing, will provide a seal, which will protect the copper foil support plate from being subjected to corrosive substances, which may cause corrosion and failing sealability.

A further advantage with this assembly method is that the foil may be coated on the inside, i.e. the side which will be facing the inside of the electron beam generating device. From a wear perspective it is an advantage to have the coating on the inside where it is protected from for example plasma. Further, if a coating is to be placed on the foil, only the sub-assembly comprising the foil and the frame need to be placed in the coating machine.

An additional advantage is related to component cost and the vulnerability of the foil. Assembling an electron beam device is a complex manufacturing method with several critical steps, one being for example the bonding of the foil to the frame and one being the optional coating of the foil. Further, the tube body and the flange are being costly components relative to the foil. By attaching the foil to a frame, and by attaching said frame to the rest of the electron beam generating device late in the manufacturing process, money may be saved if any of the steps related to the foil fails.

Preferred embodiments of the method are defined by the dependent claims.

The invention also comprises an electron exit window assembly of an electron beam generating device comprising a foil support plate and a window foil, wherein said foil support plate is arranged on a housing of the electron beam generating device, said window foil is bonded to a frame along at least one continuous bonding line, forming an exit window sub-assembly, and said exit window sub-assembly is attached to the housing.

The advantages discussed in relation to the method similarly apply also for the electron exit window assembly.

Preferred embodiments of the electron exit window assembly are defined by the dependent claims.

BRIEF DESCRIPTION OF THE DRAWINGS

In the following, an exemplary embodiment of the invention will be described in greater detail, with reference to the enclosed drawings, in which.

DESCRIPTION OF PREFERRED EMBODIMENTS

Figure 1:
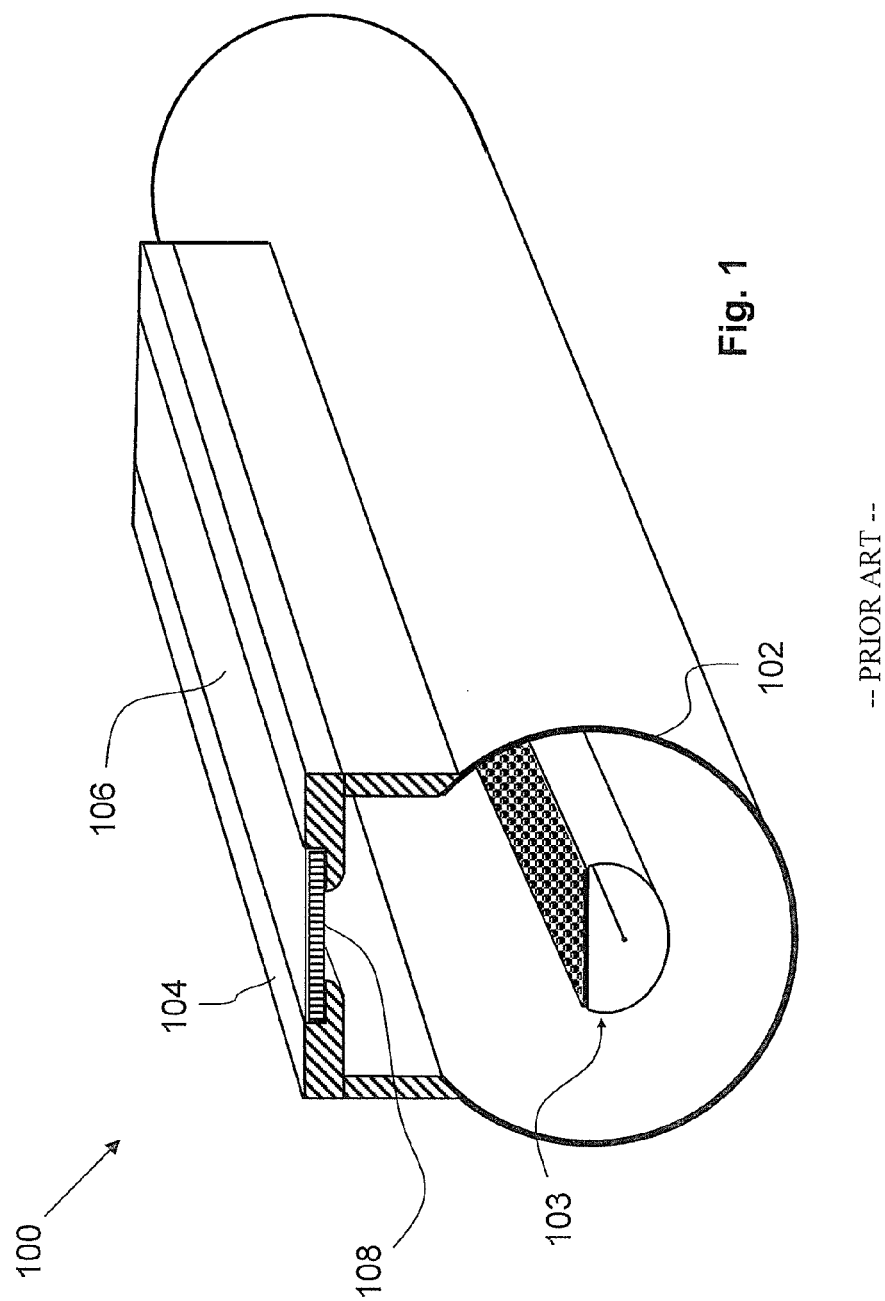
FIG. 1 is a schematic cross sectional isometric view of an electron beam device according to prior art.
Figure 2:
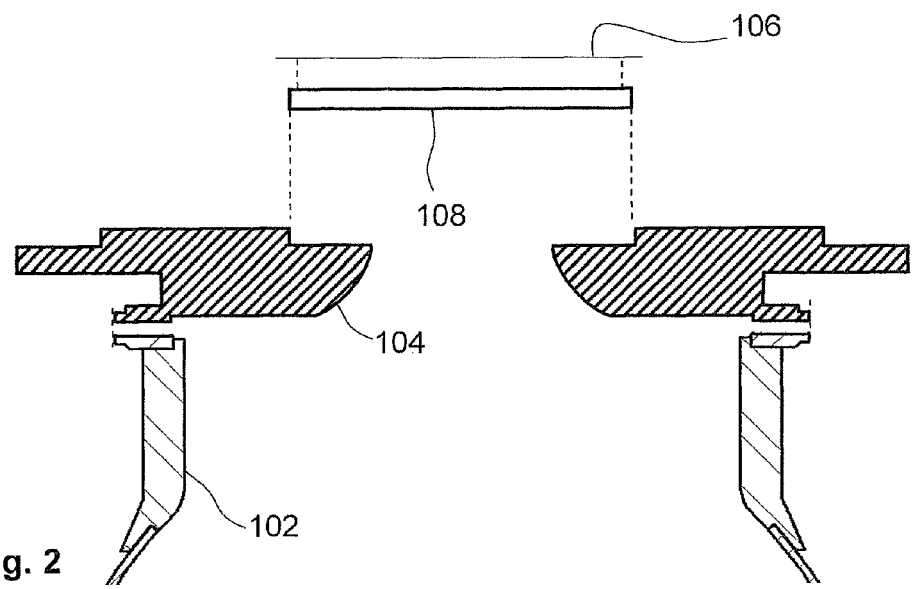
FIG. 2 is a schematic partial cross section of the device of FIG. 1, shown as an exploded view.
Figure 3:
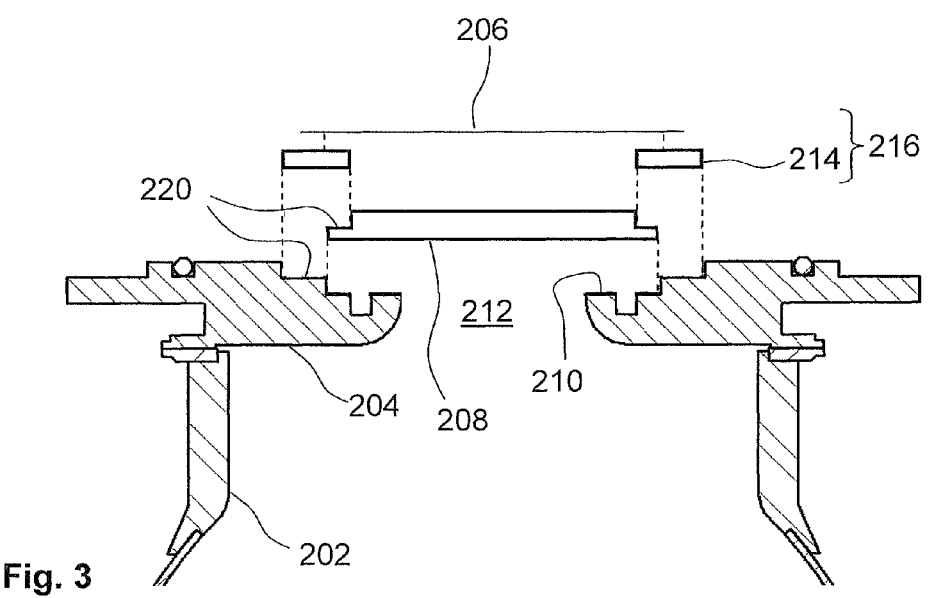
FIG. 3 is a schematic partial cross section of a device according to a first embodiment of the invention, for comparison with the cross section of FIG. 2, as shown as an exploded view.
Figure 4:
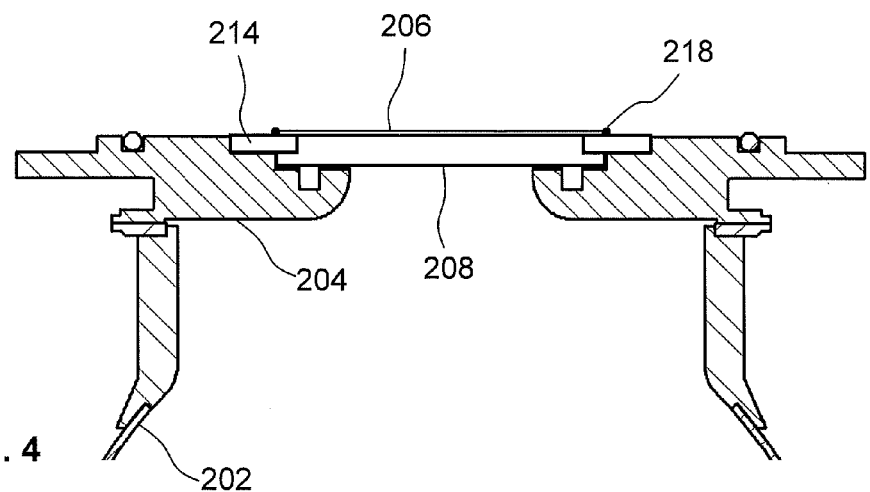
FIG. 4 is a schematic partial cross section similar to FIG. 3, but shown in an assembled state.

FIGS. 1 and 2, comprising a prior art solution, have already been described. In an exemplary embodiment of the present invention, as shown in FIGS. 3 and 4, a foil support plate 208 is arranged on the housing of an electron beam generating device. The foil support plate 208 is preferably made of copper and is bonded to a flange 204 of the housing. One possible bonding technique is brazing. The foil support plate 208 is bonded to an edge 210 of an opening 212 in the flange 204.

In a separate step, or in the same manufacturing step, said flange 204 is plasma welded to the tube body 202 forming said housing of the electron beam generating device. In another embodiment, not shown, the tube body 202 and the flange 204 is made in one piece.

In a separate step the window foil 206 is bonded onto a frame 214 to form an exit window sub-assembly 216. The word "frame" should here be interpreted as an element having a central hole configuration. The foil 206 is preferably made of titanium and said frame 214 is preferably made of stainless steel. Possible bonding techniques may be for example laser welding, electron beam welding, brazing, ultrasonic welding, diffusion bonding and gluing. In the exemplary embodiment the foil 206 is diffusion bonded onto the frame 214 along a continuous bonding line 218 partly shown in FIG. 4. The bonding line 218 is continuous to be able to maintain vacuum inside the electron beam device. The word "continuous" is used to define that the line is endless or closed. Further, it should be defined that the bonding line 218 extends along the hole configuration of the frame 214 but within the perimeter of the frame 214. Preferably, the bonding line 218 extends at a distance from the perimeter of the frame 214. Furthermore, at least one bonding line 218 is made. Thus, two or more bonding lines may be made. For example, an inner and an outer bonding line may be made on the frame 214, and the two lines may, for instance, be concentric with each other.

At this stage the foil 206 may optionally be coated and in the coating process only the exit window assembly 216 needs to be processed. According to this embodiment the foil 206 may be coated on both sides, but preferably on the inside, i.e. the side of the foil 206 which will face the inside of the electron beam generating device once assembled.

Figure 5:
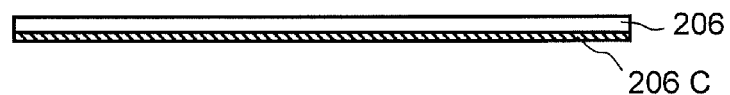
FIG. 5 is a partial cross section of a foil provided with a coating according to an embodiment of the present invention.

In FIG. 5 the foil 206 is shown with a coating denoted 206C.

The coating 206C serves the purpose of increasing thermal conductivity in order to increase the lifetime of the foil 206.

As mentioned an advantage with the present invention is the possibility of being able to provide the coating 206C to the inside of the foil 206. Plasma, which is being built up outside of the electron exit window during operation of the electron beam device, can wear down the coating of an electron exit window. However, on the inside of the foil 206 the coating 206C will be protected from the effects of plasma. Hence, there is an opportunity, with the present invention, to choose among several heat conductive coating materials, for example DLC (Diamond-like-carbon), copper, aluminium, graphite, silver and gold.

Subsequently, the frame 214, and thereby the exit window sub-assembly 216 may be attached to the flange 204 portion of the housing.

The step of attaching the exit window sub-assembly 216 to the housing is made in such a way that it forms a protection for the foil support plate 208 ensuring that the foil support plate 208 is not exposed to the environment outside of the electron beam generating device. As may be seen from FIG. 3 and FIG. 4 the frame 214 is arranged in an indentation 220 partly formed by the flange 204 of the housing and partly formed by the foil support plate 208. In an alternative embodiment, not shown, the indentation for receiving the frame may be formed in the housing only.

The frame 214 of the exit window sub-assembly 216 is preferably welded onto the housing.

It can be seen from FIG. 4 that after attachment of the exit window sub-assembly 216 onto the housing no portion of the foil support plate 208 is exposed to the outside atmosphere, and thereby corrosion of the copper foil support plate 208 is prevented.

Further to the advantages, the exit window sub-assembly 216 may be tested separately, such that the hermetic sealing in the bond, along bonding line 218, between the foil 206 and the frame 214 is confirmed before the exit window sub-assembly 216 is welded to the flange 204. Should the seal be defective the exit window sub-assembly 216 may simply be discarded without affecting the cost or production time to any great extent. The frame 214 has in this exemplary embodiment a thickness of 3 mm, and is made of stainless steel.

With the inventive solution there is an additional advantage in that the window foil 206 will be exposed to few processing steps. It should be understood that, with regard to the thinness of the foil 206, any processing work on or near the foil 206 may jeopardize the integrity of the foil 206.

The invention claimed is:

1. An electron exit window assembly of an electron beam generating device comprising a foil support plate and a window foil, wherein
    said foil support plate is arranged on a housing of the electron beam generating device,
    said window foil is bonded to a frame along at least one continuous bonding line, forming an exit window sub-assembly, the at least one continuous bonding line being one of a laser weld, an electron beam weld, a braze, an ultrasonic weld, a diffusion bond or glue, and
    said exit window sub-assembly is brought into contact with and attached to the housing after said window foil is bonded to the frame along the at least one continuous bonding line.

2. The electron exit window assembly according to claim 1, wherein said exit window sub-assembly is attached to the housing in such a way that it forms a protection for the foil support plate ensuring that the foil support plate is not exposed to the environment outside of the electron beam generating device.

3. The electron exit window assembly according to claim 1, wherein the frame of the exit window sub-assembly is arranged in an indentation partly formed by the housing and partly formed by the foil support plate.

4. The electron exit window sub-assembly according to claim 1, wherein the window foil is diffusion bonded to the frame.

5. The electron exit window sub-assembly according to claim 1, wherein the window foil is provided with a coating before attaching the exit window sub-assembly onto the housing.

6. The electron exit window assembly according to claim 5, wherein said coating is provided on the side of the window foil which faces the inside of the electron beam generating device.

7. The electron exit window sub-assembly according to claim 1, wherein the frame is welded to the housing.

8. The electron exit window sub-assembly according to claim 1, wherein the frame is made of stainless steel.

9. An electron exit window assembly of an electron beam generating device comprising a foil support plate and a window foil, wherein
- the window foil has a top surface and a bottom surface,
- the foil support plate is arranged on a housing of the electron beam generating device,
- a portion of the bottom surface of the window foil is bonded to a frame along at least one continuous bonding line, forming an exit window sub-assembly, and the entire top surface of the window foil is exposed, the at least one continuous bonding line being one of a laser weld, an electron beam weld, a braze, an ultrasonic weld, a diffusion bond or glue, and
- the exit window sub-assembly is attached to the housing.

10. An electron exit window assembly of an electron beam generating device comprising a foil support plate, a frame, and a window foil, wherein
- the foil support plate is arranged on a housing of the electron beam generating device,
- the frame possesses a top surface and a bottom surface;
- the window foil is bonded to the top surface of the frame along at least one continuous bonding line, forming an exit window sub-assembly, the at least one continuous bonding line being one of a laser weld, an electron beam weld, a braze, an ultrasonic weld, a diffusion bond or glue, and
- the bottom surface of the frame contacts the foil support plate when the exit window sub-assembly is attached to the housing.

* * * * *